US008698191B2

(12) United States Patent
Khan et al.

(10) Patent No.: US 8,698,191 B2
(45) Date of Patent: Apr. 15, 2014

(54) ULTRAVIOLET LIGHT EMITTING DIODE WITH AC VOLTAGE OPERATION

(71) Applicant: Nitek, Inc., Irmo, SC (US)

(72) Inventors: Asif Khan, Columbia, SC (US); Vinod Adivarahan, Columbia, SC (US); Qhalid Fareed, Columbia, SC (US)

(73) Assignee: Nitek, Inc., Columbia, SC (US)

( * ) Notice: Subject to any disclaimer, the term of this patent is extended or adjusted under 35 U.S.C. 154(b) by 0 days.

(21) Appl. No.: 13/897,877

(22) Filed: May 20, 2013

(65) Prior Publication Data

US 2013/0256631 A1   Oct. 3, 2013

Related U.S. Application Data

(60) Division of application No. 12/997,240, filed as application No. PCT/US2009/046525 on Jun. 6, 2009, now Pat. No. 8,507,941, which is a continuation of application No. PCT/US2007/081634, filed on Oct. 17, 2007, and a continuation of application No. PCT/US2007/081625, filed on Oct. 17, 2007.

(60) Provisional application No. 61/131,276, filed on Jun. 9, 2008, provisional application No. 60/852,672, filed on Oct. 18, 2006, provisional application No. 60/852,673, filed on Oct. 18, 2006, provisional application No. 60/953,491, filed on Aug. 2, 2007.

(51) Int. Cl.
*H01L 33/00* (2010.01)

(52) U.S. Cl.
USPC ........... 257/99; 257/81; 257/E33.012; 438/29

(58) Field of Classification Search
None
See application file for complete search history.

(56) References Cited

PUBLICATIONS

International Search Report and Written Opinion of the International Searching Authority, PCT/US2009/046525, Park, Jan. 20, 2011.

*Primary Examiner* — Sonya D McCall Shepard
(74) *Attorney, Agent, or Firm* — Michael A. Mann; Nexsen Pruet, LLC

(57) ABSTRACT

Ultraviolet light emitting illuminator, and method for fabricating same, comprises an array of ultraviolet light emitting diodes and a first and second terminal. When an alternating current is applied across the first and second terminals and thus to each of the diodes, the illuminator emits ultraviolet light at a frequency corresponding to that of the alternating current. The illuminator includes a template with ultraviolet light emitting quantum wells, a first buffer layer with a first type of conductivity and a second buffer layer with a second type of conductivity, all deposited preferably over strain-relieving layer. A first and second metal contact are applied to the semiconductor layers having the first and second type of conductivity, respectively, to complete the LED. The emission spectrum ranges from 190 nm to 369 nm. The illuminator may be configured in various materials, geometries, sizes and designs.

31 Claims, 12 Drawing Sheets

ULTRAVIOLET LIGHT EMITTING DIODE WITH AC VOLTAGE OPERATION

CROSS-REFERENCE TO RELATED APPLICATIONS

The present application is a divisional application of U.S. non-provisional patent application Ser. No. 12/997,240 filed 9 Dec. 2010 which is a national phase filing of PCT/US2009/046525 filed 6 Jun. 2009 and published as WO2009/152062A3. Also, through U.S. non-provisional patent application Ser. No. 12/997,240, applicant claims the priority benefit of U.S. provisional patent application Ser. No. 60/852,672 filed 18 Oct. 2006, via PCT/US2007/081634 filed 17 Oct. 2007 and published as WO2008/054995, which entered that national phase via U.S. non-provisional patent application Ser. No. 12/445,945 filed 17 Apr. 2009 and which issued as U.S. Pat. No. 8,242,485 on 14 Aug. 2012. Also through U.S. non-provisional patent application Ser. No. 12/997,240, Applicant claims the priority benefit of U.S. provisional patent application Ser. Nos. 60/852,673, filed 18 Oct. 2006 and 60/953,491, filed 14 Aug. 2007, via PCT/US2007/081625 filed 17 Oct. 2007 and published as WO2008/054994, which entered that national phase via U.S. non-provisional patent application Ser. No. 12/445,959 filed 17 Apr. 2009 and which issued as U.S. Pat. No. 8,304,756 on 6 Nov. 2012. All of the above-cited priority applications are incorporated herein in their entirety by reference.

BACKGROUND

The present invention relates to single chip or multiple chip light emitting diodes (LEDs) or ultraviolet radiating illuminator, and more particularly to single or multiple chip ultraviolet light emitting diodes that operate under standard alternating current (AC) high voltage conditions for various applications including water purification, air purification, germicidal lamps, ultraviolet curing, etc.

Group III nitride LED systems have proven to be efficient, compact and robust solid-state UV optical sources and sensors. This has stimulated the development of ultraviolet optical devices. Rapid progress in material growth, device fabrication and packaging enabled demonstration of high efficiency visible-blind and solar-blind photodetectors, deep-UV light emitting diodes (UVLED) with emission from 250 to 400 nm, and UV laser diodes with operation wavelengths ranging from 340 to 350 nm. Applications of these UV optical devices include flame sensing; fluorescence-based biochemical sensing; covert communications; air, water, and food purification and disinfection; and biomedical instrumentation.

Currently, semiconductor LEDs are energized by direct current (DC) with typical operating voltages of a few volts for red LEDs of about 2 volts, for blue LEDs of about 3-4 volts and for UVLEDs of about 4-7 volts. However, substantially all the houses and buildings are wired with 110-120 volt power/50 Hz AC in North America or 208-240 volt/50-60 Hz power sources in most countries around the world. When LEDs are used for ultraviolet purification, biochemical sensing, biomedical instrumentation, and the like, the AC current is converted to low voltage DC. This greatly increases package size or requires additional conversion equipment which increases the cost to the consumer.

A need remains in the art of ultraviolet light emitting diodes for standard high AC voltage (such as 110 volts, 220 volts, etc.) operation.

SUMMARY OF THE INVENTION

It is an object of the present invention to provide a UV or deep UV LED which provides illumination when energized with alternating current.

It is a particular object of the invention to provide a UV or deep UV led which appears to the naked eye to provide continuous illumination.

Another feature of present invention is the formation of array of UV or deep UVLED that provides ultraviolet radiation when energized with alternating current.

Yet another feature of present invention is the formation of single or a multichip array of UV or deep UV LEDs connected in series and parallel with the ultraviolet light diode formed in a micropixel light emitting diode design wherein individual micropixels are emitting ultraviolet light when energized with alternating current.

Another feature of present invention is the formation of single or a multichip array of UV or deep UV LEDs connected in series and parallel with the ultraviolet light emitting diode formed over a pulsed lateral overgrown Group III nitride layer. The pulsed lateral overgrown layer is deposited using a pulse growth mode and the individual ultraviolet light emitting diode emits ultraviolet light when energized with alternating current.

Another feature of the present invention is the formation of single or a multichip array of UV or deep UV LEDs connected in series and parallel with the ultraviolet light emitting diode formed in a vertical geometry ultraviolet light emitting diode wherein the individual vertical ultraviolet light emitting diode emits ultraviolet light when energized by alternating current.

In another feature of present invention, the illumination mode of the UV or deep UV LED that is driven by AC has decreased heat accumulation and a higher energy utilization efficiency than that of the UV or a deep UV LED driven by DC.

Other features and their advantages will be apparent to those skilled in the art of ultraviolet light emitting diodes and ultraviolet light emitting diodes operable in an alternating current voltage in particular from a careful reading of the foregoing Detailed Description of Preferred Embodiments, accompanied by the following drawings.

DETAILED DESCRIPTION

Figure 1:
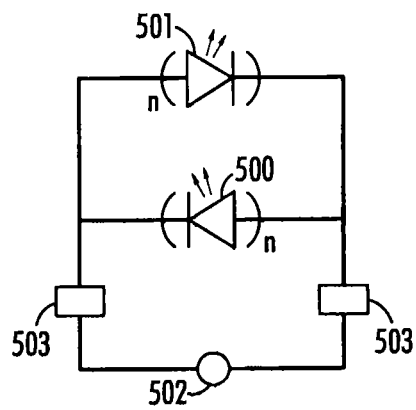
FIG. 1 is a schematic representation of an embodiment of the present invention.

The present invention is directed to a UV or Deep UV LED which is operable with AC voltage.

In the current invention, ultraviolet light emitting diodes with emission wavelengths from 200 nm to 400 nm, emit ultraviolet radiation under AC operation by wiring discrete LEDs with opposing polarity. More specifically, the cathode of one LED is in electrical contact with the anode of the other. When LEDs are connected to a low voltage AC circuit the LEDs thus connected illuminate alternately. In this configuration, one LED is biased by the positive voltage side of the AC cycle, referred to herein as forward biased, and the other LED is biased by the negative voltage cycle of the AC cycle, referred to herein as reverse biased. Since AC current usually runs at about 60 Hz each LED alternately emits ultraviolet light at a frequency of about 60 Hz with each being out of phase with the other. The result is illumination at about 120 Hz which appears to be continuous illumination to the naked eye.

The invention will be described with reference to the various figures. In the figures similar elements will be numbered accordingly.

It is well known to those skilled in the art that an active LED comprises semiconducting materials doped with impurities to form a p-n junction. Current flows from the p-side, or anode, to the cathode, or n-side, but not in the reverse direction without a reversal in current. The wavelength of radiation is dependent on the band gap energy of the materials forming the p-n junction. Though not limited thereto the present invention is particularly well suited for use in nitride-based light emitting devices such as Group III-nitride based devices. "Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds such as AlGaN and AlInGaN are particularly preferred. As is well understood in the art, the Group III elements can combine with nitrogen to form binary compounds such as GaN, AlN and InN; ternary compounds such as AlGaN, AlInN, and GaInN; and quaternary compounds, specifically AlInGaN. In each case the empirical formula is GN wherein G represents a Group III element or mixture of elements or one mole of nitrogen is combined with a total of one mole of the Group III elements. The semiconductor material is not particularly limited herein yet the advantages of the present invention are most readily appreciated in an LED based on Group III nitrides with the most preferable compound being $AlIn_YGa_{1-X-Y}N$ wherein $0 \leq x \leq 1$, $0 \leq y \leq 1$, $0 \leq x+y \leq 1$) optionally doped with a material to form an n-type or p-type semiconductor. Between the n-type and p-type is a quantum well and most preferably a multilayered quantum well which may or may not be doped.

The devices of the present invention are particularly suitable for flame sensing; fluorescence-based biochemical sensing; covert communications; air, water, and food purification and disinfection; biomedical instrumentation and the like.

In another embodiment of invention, multiple ultraviolet light emitting diodes (UVLED) operating under AC voltages, are connected in an array. In a particularly preferred embodiment a single chip with integrated UVLEDs comprises of plurality of series connected UVLEDs in a single array, two array or more than two arrays. The opposite polarities of arrays are connected together and then connected to the AC power source. During the positive half of the AC cycle, one array of UVLEDs is forward biased while the other array is reverse biased. During the negative half of the AC cycle, the other array of UVLEDs is forward biased and thus the first array is reverse biased and thus not energized. The arrays are alternately energized and deenergized at the frequency of the AC power source. A continuous supply of UV radiation under AC operation is realized with the multi-array design.

In another embodiment of invention, multiple ultraviolet light emitting diodes (UVLED) operating under AC voltages, are connected in an array. In a particularly preferred embodiment a single chip with integrated UVLEDs comprises of plurality of parallel-connected UVLEDs in a single array, two array or more than two arrays. The oppositely polarized arrays are connected together and then connected to the AC power source. During the positive half of the AC cycle, one array of UVLEDs is forward biased while the other array is reverse biased. During the negative half of the AC cycle, the other array of UVLEDs is forward biased and thus the first array is reverse biased and thus not energized. The arrays are alternately energized and deenergized at the frequency of the AC power source. A continuous supply of UV radiation under AC operation is realized with the multi-array design.

In another embodiment of invention, multiple ultraviolet light emitting diodes (UVLED) operating under AC voltages are connected in an array. In a particularly preferred embodiment a single chip with integrated UVLEDs comprises of plurality of series- and parallel-connected UVLED in a single array, double array or more than two arrays. The oppositely polarized arrays are connected together and then connected to the AC power source. During the positive half of the AC cycle, one array of UVLEDs is forward biased while the other array is reverse biased. During the negative half of the AC cycle, the other array of UVLEDs is forward biased and thus the first array is reverse biased and thus not energized. The arrays are alternately energized and deenergized at the frequency of the AC power source. A continuous supply of UV radiation under AC operation is realized with the multi-array design.

An embodiment of the invention is illustrated schematically in FIG. 1. In FIG. 1, at least one first biased diode, 500, is in a parallel circuit with at least one second biased diode, 501, wherein the first biased diode and second biased diode are oppositely biased. For the purposes of discussion, the first biased diodes are described herein as forward biased and the second biased diodes are referred to herein as reverse biased. This first biased diodes can be a single ultraviolet LED or an array of ultraviolet LEDs. Similarly, the second biased diode can be a single ultraviolet LED or an array of ultraviolet LEDs. An AC power source, 502, provides alternating current. As the voltage increases, at a frequency defined by the AC power source, the first biased diodes illuminate and the second biased diodes are dark. As the voltage peaks and begins to decrease the first biased diode goes dark and the second biased diode begins to illuminate. Each diode will illuminate once within each cycle. Components, 503, are provided as would be realized in the art of electronic circuitry for protection and dampening. In particular, passive components such as capacitors, resistors and the like are mentioned as are active components such as controllers and the like. Other devices such as rheostats, meters, etc. are also mentioned as being useful in some devices. The configuration of FIG. 1 allows the anode of one LED and cathode of a second LED to be on the same side of the device as will be more apparent from further descriptions herein. As would be realized, a series of UVLEDs can be incorporated up to an integer "n" limited only by the desired size of the device.

Figure 2:
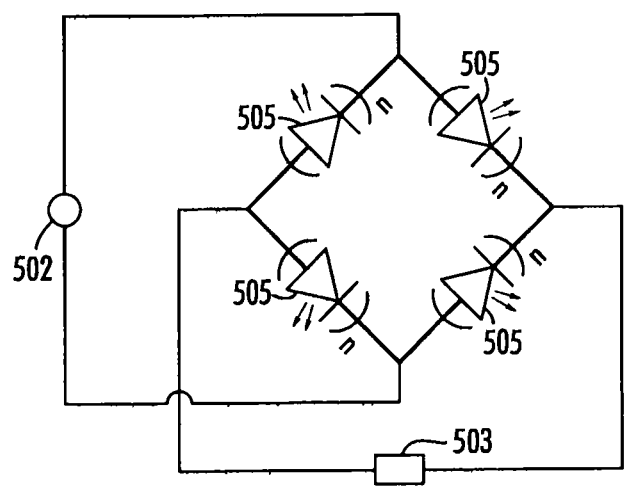
FIG. 2 is a schematic representation of an embodiment of the present invention.

Another embodiment of the invention is illustrated schematically in FIG. 2. In FIG. 2 the LED's are arranged in a bridge circuit. The power source, 502, is connected to a bridge with diodes, 505, on the bridge. As current alternates alternate branches of the bridge illuminate. Additional components, 503, would be included as described above.

In another embodiment of invention the UVLED comprises a micro-LED with single chip or a multi-chip design and said UVLED is operable with AC voltage.

In another embodiment of invention, the UVLED comprises a vertically conducting single chip or a multiple chips and the said UVLED is operable with AC voltage.

In another embodiment of invention, the UVLED comprises of pulsed lateral overgrown based single chip or a multiple chips and the said UVLED is operable with AC voltage.

In another embodiment of invention, the UVLED is a semipolar or a non-polar UVLED and the said UVLED is operable with AC voltage.

Figure 6:
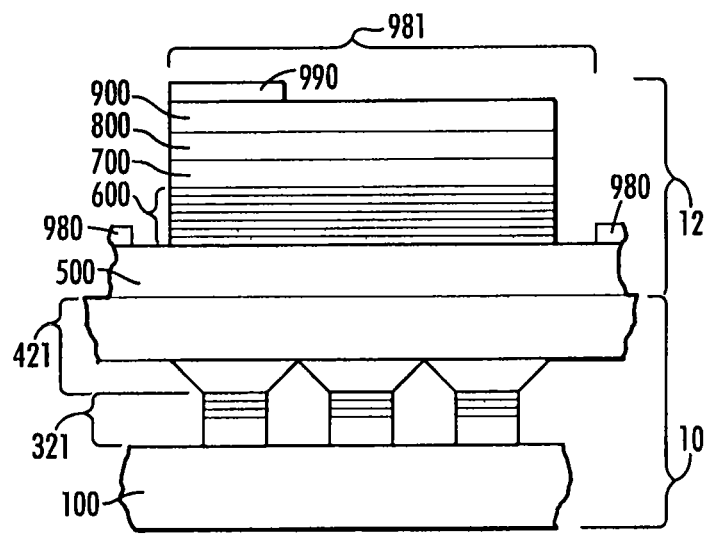
FIG. 6 is a schematic diagram of the epilayer structure of a single light emitting diode of an array, according to a preferred embodiment of the present invention.

In one embodiment of the invention an array of light emitting devices (LED) and a method for making an array of LED's, particularly one that emits deep ultraviolet light is provided. With reference to FIG. 6, a template, 10, is provided that serves as a platform for an array of ultraviolet light emitting structures, 12. Briefly, template 10 includes a substrate, and a first buffer layer added onto the substrate as the first step in forming the LED wafer.

The template may include a substrate but has two buffer layers, one of which is trenched and the second of which preferably forms a coalesced planar layer over the first. The coalescing involves performing PLOG over deep trenches (height≥0.4 μm in case of AlN), or over shallow or deep trenches if the pillars encompass more than one group III species or a combination of multiple layers. The pillars may comprise a multi-layer stack of III-Nitride based semiconductors including AlN, and a strain-relieving superlattice in an array. In some embodiments additional layers are included in the pillars on top of the superlattice including $Al_xIn_yGa_{1-x-y}N$ (wherein 0<x≤1, 0≤y≤1, and 0<x+y≤1), and additional superlattices with different average composition than the first superlattice. The second buffer layer, of AlN or $Al_xIn_yGa_{1-x-y}N$ (wherein 0<x≤1, 0≤y≤1 and 0<x+y≤1), is grown by PLOG techniques over the etched pillars preferably until it coalesces to form a planar surface. The ultraviolet light emitting structure deposited on top of the planar surface on the template consists of PALE or conventional MOCVD deposited AlN, and in some embodiments an additional strain relief superlattice is deposited on the AlN. A thick (thickness ≥1.5 μm) undoped or n-type $Al_xIn_yGa_{1-x-y}N$ (wherein 0<x≤1 and 0≤y≤1, and 0<x+y≤1) layer is deposited next. If the $Al_xIn_yGa_{1-x-y}N$ (wherein 0<x≤1, 0≤y≤1 and 0<x+y≤1) is undoped, an additional n-type $Al_xIn_yGa_{1-x-y}N$ (wherein 0<x≤1 and 0≤y≤1) layer is deposited. This is followed by the quantum well active region and p-type $Al_xIn_yGa_{1-x-y}N$ (wherein 0≤x≤1, 0≤y≤1 and 0≤x+y≤1) materials that form the top electrode for the light emitting device. Without wishing to be bound by theory, the superior performance of the present light emitting diodes is attributed to the combination of reduced thermal impedance from the thick PLOG growth AlN or $Al_xIn_yGa_{1-x-y}N$ (wherein 0<x≤1, 0≤y≤1 and 0<x+y≤1) material, and a lower overall defect density in the laterally overgrown AlN or $Al_xIn_yGa_{1-x-y}N$ (wherein 0<x≤1, 0≤y≤1 and 0<x+y≤1) buffer. A current spreading layer is applied to the n-type layer wherein the current spreading layer is separated from the furthest inward extent of the n-type layer by no more than the current spreading length.

The first buffer layer is then etched to form a pattern of trenches with etch depth greater than or equal to 0.4 μm if the buffer is AlN and the substrate is sapphire, or greater than or equal to 0.1 μm if the first buffer layer consists of one or more AlInGaN layers. After patterning the wafer, a second buffer is applied to the first buffer. In one embodiment the second buffer layer coalesces over the etched portion. Next, the ultraviolet light emitting structure, 12, is applied to the template, 10. First, a semiconductor layer having a first type of conductivity is applied, followed by several layers forming a quantum-well region with an emission spectrum ranging from 190 nm to 369 nm. Another semiconductor layer, or possibly more than one, having a second type of conductivity is applied next. Two metal contacts are applied to this construction. A leakage suppression layer, 980, is applied to the semiconductor layer having the first type of conductivity and a metal contact, 990, is applied to the other semiconductor layer having the second type of conductivity, to complete the LED. Each of these layers will be described in detail below. The charge spreading layer is separated from the furthest inward extent of the LED by a distance, 981, which is no larger than the current spreading length.

Several of the layers and buffer layers are applied using a pulsed atomic layer epitaxy (PALE) growth technique, and the layer grown on the patterned wafer is grown using pulsed lateral overgrowth (PLOG) techniques. Each layer other than the substrate, which is preferably sapphire, is made of a Group III-nitride, preferably $Al_xIn_yGa_{1-x-y}N$ (wherein $0<x\leq1$, $0\leq y\leq1$ and $0<x+y\leq1$). In employing pulsed lateral overgrowth techniques, the precursor sources include a metal-organic source (preferably trimethyl aluminum, trimethyl gallium, triethyl gallium, trimethyl indium, ammonia, a carrier gas (such as hydrogen and/or nitrogen) and, optionally, doping sources such as silane, and/or biscyclopentadienyl magnesium.

Figure 3:
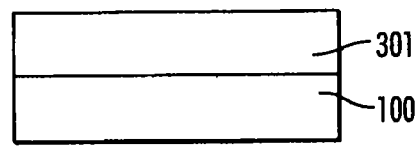
FIG. 3 is a schematic diagram of the epilayer structure of a portion of a light emitting diode having a single III-Nitride buffer layer.
Figure 4A:
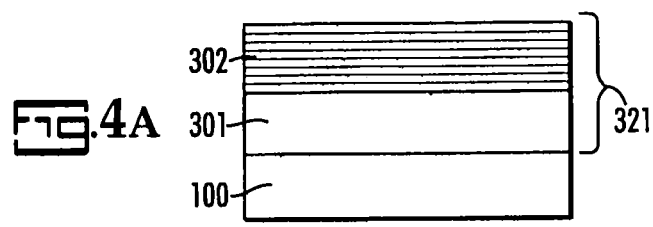
FIG. 4*a* is a schematic diagram of the epilayer structure of a portion of a light emitting diode having multiple III-Nitride buffer layers.
Figure 4B:
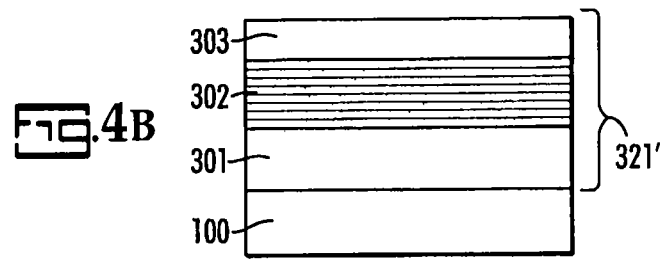
FIG. 4*b* is a schematic diagram of the epilayer structure of a portion of a light emitting diode having multiple III-Nitride buffer layers.
Figure 4C:
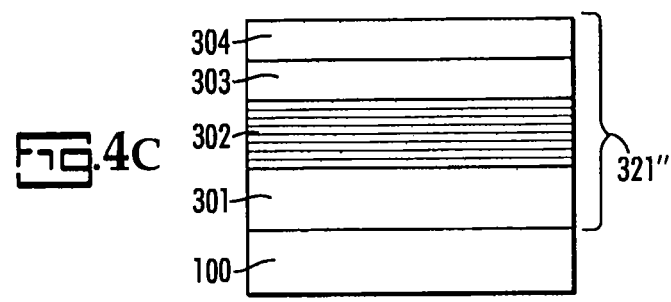
FIG. 4*c* is a schematic diagram of the epilayer structure of a portion of a light emitting diode having multiple III-Nitride buffer layers.

FIGS. 3-5 show various embodiments of template, 10, of the present LED as it is constructed. As shown in FIG. 3, a first buffer layer, 301, is grown on a substrate, 100. Sapphire is a preferred substrate. First buffer layer, 301, is made of a Group III-Nitride material, preferably $Al_xIn_yGa_{1-x-y}N$ (wherein $0<x\leq1, 0\leq y\leq1$ and $0<x+y\leq1$). Alternatively, as shown in FIG. 4A-4C, a first buffer layer, 321, may actually be made of multiple sub-layers. FIGS. 4A, 4B, and 4C show three different implementations of first buffer layer 321, 321' and 321", respectively, using sub-layers 301, 302, 303, 304 of a Group III-Nitride material, preferably $Al_xIn_yGa_{1-x-y}N$ (wherein $0<x\leq1, 0\leq y\leq1$ and $0<x+y\leq1$). Sub-layer, 301, is preferably made of $Al_xIn_yGa_{1-x-y}N$ (wherein $0<x\leq1, 0\leq y\leq1$ and $0<x+y\leq1$). Sub-layer, 302, is preferably an AlInGaN/AlInGaN super-lattice. Sub-layer 303 is preferably undoped AlInGaN while sub-layer 304 is AlInGaN doped with silicon. Buffer layer 321 in FIG. 4A includes sub-layers 301 and 302. Buffer layer 321' in FIG. 4B includes sub-layers 301, 302, and 303. Buffer layer 321" in FIG. 4C includes sub-layers 301, 302, 303, and 304.

The first III-Nitride buffer layer 321 is grown to approximately 0.1-5 μm thick, depending on the composition and sequence of layers used, over a substrate 100 using a combination of the pulsed atomic layer epitaxy (PALE) technique and conventional metal-organic chemical vapor deposition (MOCVD). First buffer layer 321 is preferably formed of at least one sub-layer of $Al_xIn_yGa_{1-x-y}N$, wherein (wherein $0<x\leq1, 0\leq y\leq1$ and $0<x+y\leq1$)

Next, a portion of the final LED epilayer is trenched. The trenching is done in first buffer layer 321, and may also extend into substrate 100. The trenching process is performed using standard photolithographic techniques in combination with either wet or dry etching processes that are well established in the prior art. However, the trenches can be much deeper than in the prior art. In particular, the trenches are at least 0.4 μm deep if the first buffer layer is made of AlN and at least 0.1 μm deep if the first buffer layer 321, 321' or 321" are used.

Figure 5A:
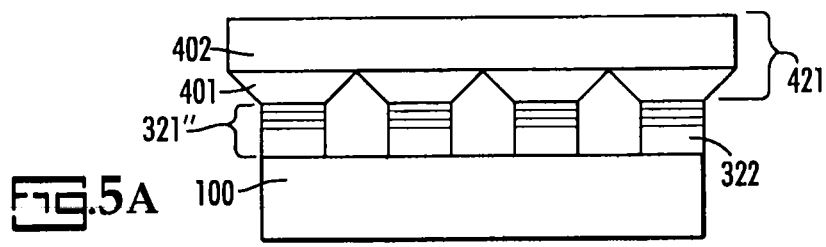
FIG. 5*a* is a schematic diagram of a portion of the epilayer structure of the light emitting diode of FIG. 6, shown with a portion of the first buffer now trenched according to a preferred embodiment, and with a laterally overgrown PLOG buffer.
Figure 5B:
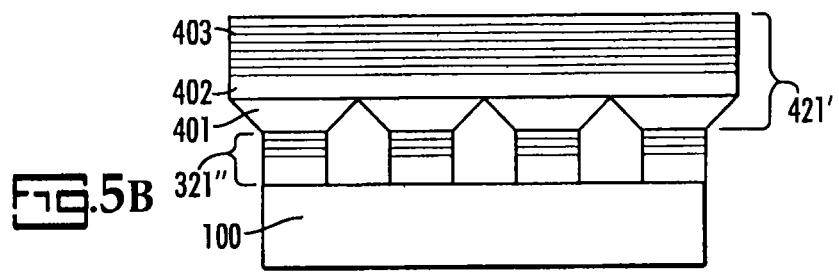
FIG. 5b is a schematic diagram of a portion of the epilayer structure of the light emitting diode of FIG. 6, shown with a portion of the first buffer now trenched according to a preferred embodiment, and with a laterally overgrown PLOG buffer.
Figure 5C:
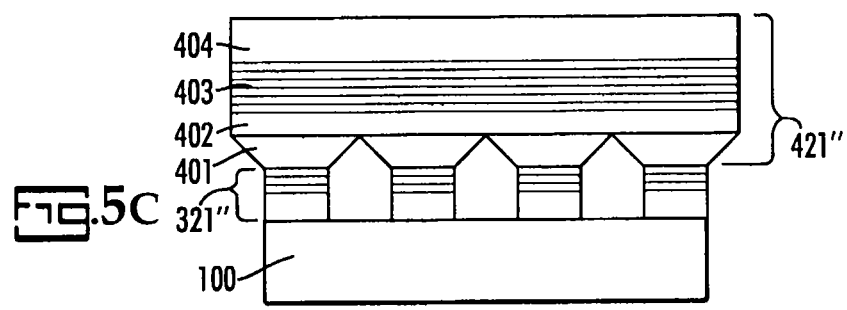
FIG. 5c is a schematic diagram of a portion of the epilayer structure of the light emitting diode of FIG. 6, shown with a portion of the first buffer now trenched according to a preferred embodiment, and with a laterally overgrown PLOG buffer.

Trenching is the selective removal of material leaving narrow strips of material or pillars remaining as seen in FIGS. 5A-5C. These narrow strips may be straight or curved but are preferably parallel and most preferably patterned, such as for example in stripes, circles, hexagons, squares or rectangles.

After patterning a layer 401 is applied to the first buffer by pulsed lateral overgrowth techniques so that it will grow laterally. It is preferable that the lateral growth continues until coalescence thereby bridging the gaps between the stripes as illustrated in FIG. 5A-5C. Layer 401 is preferably made of $Al_xIn_yGa_{1-x-y}N$ (wherein $0<x\leq1, 0\leq y\leq1$ and $0<x+y\leq1$). After the layer 401 is completed, as shown for each of the three embodiments illustrated in FIG. 5A-5C, additional layers may be deposited to complete alternate preferred embodiments of second buffer layers 421, 421' and 421".

FIG. 5A shows one implementation of a second buffer, 421, on top of the epilayer construction shown in FIG. 4C, after trenching first buffer layer 321" to form pillars 322. Note that any first buffer layer: 321, 321' or 321", could be used, but only the epilayer of FIG. 4C, namely with first buffer layer 321", is shown in FIGS. 5A-5C in order to simplify the drawings. FIGS. 5B and 5C show additional implementations of the second buffer, 421, namely, 421' and 421", in FIGS. 5B and 5C, respectively, with sub-layers 401, 402, 403, and 404 shown in particular combinations in each of FIGS. 5A-5C. FIG. 5A shows second buffer layer, 421, which includes sub-layers, 401 and sub-layer 402. FIG. 5B shows second buffer layer, 421', which includes sub-layers 401, 402, and 403. FIG. 5C shows second buffer layer, 421", which includes sub-layers 401, 402, 403, and 404.

FIG. 6 illustrates template 10 of FIG. 5C, now with a layered, UV-emitting structure, 12, thereon (which UV-emitting structure including layers 500, 600, 700, 800 and 900), as will be described below, plus metal contacts 980 and 990. Except for metal contacts, 990 and 980, and the substrate 100, all layers are made of III-Nitride material.

Buffer layer 321, and in some cases substrate 100, is then trenched. After trenching, the PLOG layer 401 is grown on the buffer layer to cause the wafer surface preferably to coalesce over the formed trenches (see FIGS. 5A, 5B, 5C and 6). The Group III-Nitride PLOG layer 401 is grown by pulsing at least one precursor source to enhance the lateral growth rate over vertical growth rate until PLOG layer 401 is of sufficient thickness and more preferably completely coalesced and has regions with dislocation densities less than that of buffer layer 321.

In one embodiment the buffer layers are grown over each pillar without coalescence thereby forming discrete LED's on a common substrate. In this embodiment each subsequent layer referred to herein is a distinct layer which is physically distinct from an identical layer on an adjacent pillar.

Subsequently, additional AlInGaN layers are deposited that together with 401, form a second buffer 421. These layers are shown as 402, 403, and 404 in FIGS. 5A, 5B, and 5C. These layers help to minimize overall strain of the epitaxial layer and also assist with epitaxial planarization that has beneficial effects for the light emitting device active region.

Then, as illustrated in FIG. 6, the LED structure is added to the epilayer beginning with another III-Nitride layer 500 but with a first type of conductivity, applied directly on second buffer 421, preferably an n+ layer made of $Al_xIn_{1-x}Ga_{1-x-y}N$ (wherein $0<x\leq1, 0\leq y\leq1$ and $0<x+y\leq1$) is formed such that the layer is transparent to light to be emitted from the quantum well active region. Another III-Nitride superlattice layer 600 is then formed which includes one or more barrier and one or more well sub-layers, each having different compositions such that the band-gap of the barrier layer is larger than that of the well layer. The thickness of the barrier and well layers should be between 1-200 Å. This well sub-layer has a specific band-gap and is designed to provide a region with good quantum confinement, wherein electrons and holes readily combine, preferably with radiative and non-radiative recombination but with radiative recombination dominating the non-radiative recombination. The quantum well sub-layer emits light in the range of 190 nm to 369 nm. Both layers 500 and 600 are given their first type of conductivity using silicon, or are co-doped using a combination of silicon, oxygen, and/or indium. Layer 500 has a band gap lower than the PLOG layer 401 but higher than the quantum well and barrier sub-layers of 600. In some implementations, the well sublayers are undoped.

A p-type AlInGaN electron blocking layer 700 is preferably incorporated directly above the active region layer, 600, such that the band-gap of 700 is larger than the bandgap of the barrier sublayer in 600. Magnesium is used as the p-type dopant. Two additional p-type AlInGaN layers, 800 and 900, are formed on top of 700 such that the band-gap of the layers decreases for each subsequent layer. Layer 800 may be one single AlInGaN layer, or may consist of a compositionally graded layer, a series of decreasing composition superlattices, or several distinct layers with decreasing bandgap.

A mesa-type LED may then be fabricated, the type shown in FIG. 6, using reactive ion etching (RIE) to access the bottom n+ layer. Note that this type device's geometry results in only a portion of the active area containing low-defect density laterally grown "wing" regions. Finally, probe metal conducting pads 980, 990 are deposited on both the n+ and p+ layers, respectively. Ti/Al/Ti/Au and Ni/Au are used as metal contacts for the n- and p-contacts, respectively, however, the n-metal contacts can be made of Ti, Al, Ni, Au, Mo, Ta or any combination of these metals. The second contact, the p+ layer contact, can be made of Pd, Ni, Ag, Au, ITO, NiO, PdO or any combination of the above-mentioned metals. These contacts could be annealed in air, a forming gas, nitrogen or any combination of such. In one embodiment, the anneal temperature cycle is a single step with a temperature range of 650° C.-950° C. In another embodiment, the annealing cycle may comprise multiple step annealing. The second metal electrode on top of individual pillars are thickened by depositing additional titanium and gold layers. Annealing of said second electrode is done in nitrogen ambient. In another embodiment, the annealing can be done in air, oxygen ambient also.

Mesa etching preferable employs a mask comprising titanium, nickel and platinum which can be deposited by e-beam evaporation, sputtering or the like. Boron trichloride, chlorine and argon gas represent preferred materials in the etching chamber. The reactive ion etching, or dry etching, preferably comprises either inductively coupled plasma or reactive ion plasma. This dry etching comprises a multistep RF power modulation with chlorine, boron chloride, carbon tetrachloride, methane, fluorine, argon gas or a combination of such gases.

In an alternative embodiment, the etching may be done by dry etching followed by wet chemical etching. For wet chemical etching the device may be dipped and the semiconductor layers boiled in organic solution such as acetone, toluene or iso-propanol. The layers may also be dipped in acidic solutions such as aqua-regia, buffered HF, HF, HCl and the like.

In an alternative configuration, after construction the substrate may be removed by polishing, etching or lifting-off using a laser and then a metallic contact layer can be applied to the backside of the n-layer 500. In this configuration, contact 980 is located on the backside of 500 instead of the topside and can be located vertically below the p-contact 990.

Figure 7:
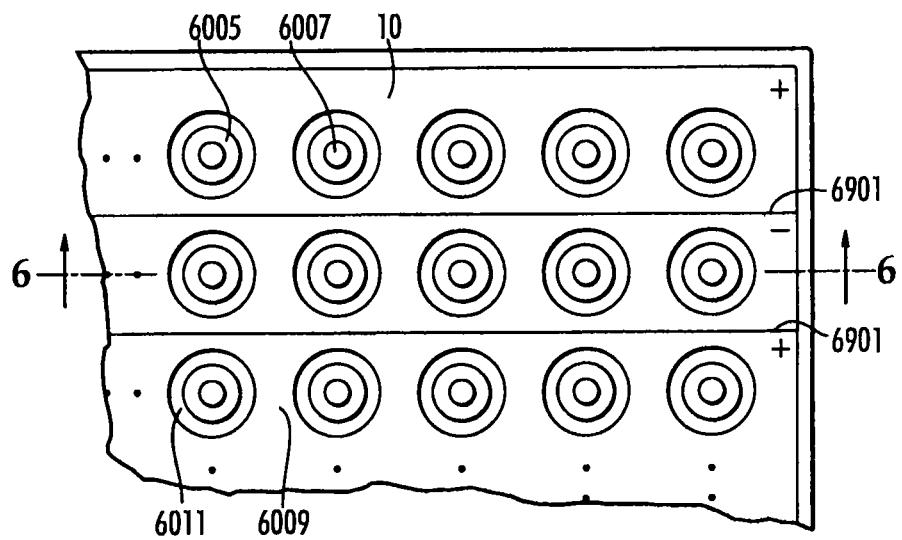
FIG. 7 is a top perspective view of a partial schematic representation of an embodiment of the invention.
Figure 8:
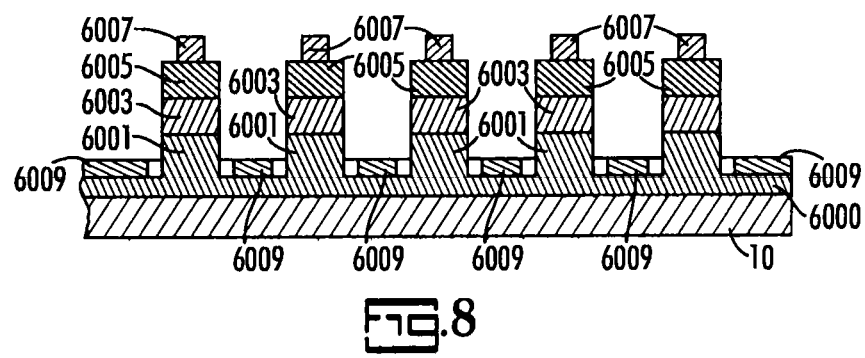
FIG. 8 is a side view of a schematic representation of an embodiment of the invention.

An embodiment of the invention prior to formation of a second electrical contact is illustrated schematically in top view in FIG. 7 and in cross-sectional view in FIG. 8. A substrate, 10, as described previously comprises the layer of first conductivity, 6000, applied thereto. It is preferred that the layer of first conductivity is an n-type layer. The layer of first conductivity has mesas, 6001, of common composition. The mesas may be formed during layer formation or the area there between may be etched. On the surface of each mesa is a quantum well, 6003. On the surface of the quantum well is a layer of second conductivity, 6005. The layer of second conductivity has a conductivity which is different than the conductivity of the layer of first conductivity as would be realized. The layer of first conductivity, quantum well and layer of second conductivity, taken together, form an LED and each layer may include multiple sublayers as further described herein. A second conductor, 6007, is in electrical contact with the layer of second conductivity. A charge spreading layer, 6009, is applied to the layer of first conductivity. It is preferred that the charge spreading layer be separated from the mesa by a gap, 6011, which may have non-conductive material therein. The separation between the mesa and charge spreading layer insures that electrical contact between the charge spreading layer and quantum well and/or second conductivity layer does not occur during manufacturing. It would be apparent that a current between the charge spreading layer and second conductive layer of a given LED would cause the LED to emit light. Insulators, 6901, allow regions to be separated such that connectivity between an anode of one LED, or group of LEDs, can be made to the cathode of a second LED, or group of LEDs.

The equivalent diameter of the mesas, also referred to as micropillars, is preferably about 500 µm or less. The equivalent diameter is the diameter of a circle with a surface area equivalent to the surface area of the shape being measured.

Figure 9:
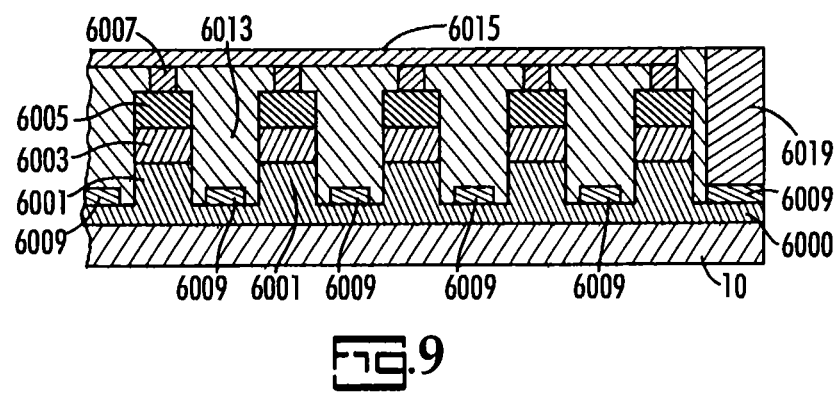
FIG. 9 is a side view of a schematic representation of an embodiment of the invention.
Figure 10A:
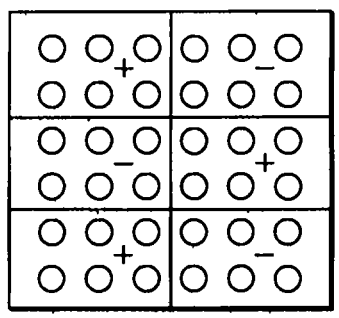
FIG. 10A illustrates a particularly preferred embodiment.
Figure 10B:
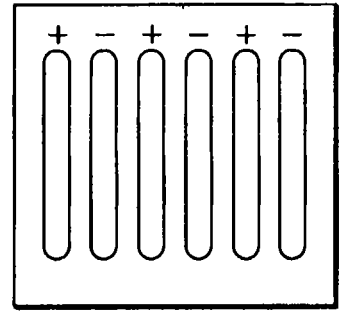
FIGS. 10B-F illustrate various embodiments of the invention.
Figure 10C:
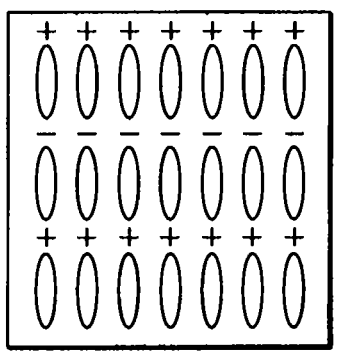
Figure 10D:
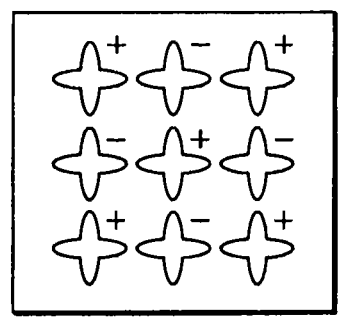
Figure 10E:
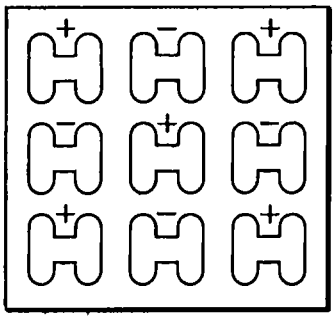
Figure 10F:
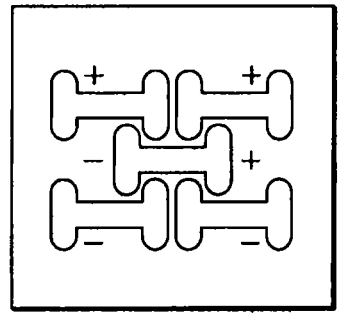

FIG. 9 is a cross-sectional schematic view of another embodiment of the invention. In FIG. 9, the area between the mesas comprises a passivation material, 6013, which forms a leakage current suppression layer. The device is planarized such that the leakage suppression layer and conductive layers form a single plane and a third conductive layer, 6015, is applied to be in contact with the second conductors, 6007. The third conductive layer can be a continuous layer such that when current is applied all LED's emit in unison. Alternatively, the third conductive layer may be in electrical contact with select LED's thereby allowing the LED's to illuminate individually or in select combinations. A conductive pillar, 6019, is formed such that the first and second conductors are terminated at a common face to facilitate flip-chip mounting as will be more fully described.

A particularly preferred embodiment is illustrated in FIG. 10. In FIG. 10, the embodiment of FIG. 9 is illustrated as mounted on a thermal carrier, also referred to as a conductive substrate, 7000. This is referred to as a flip-chip mounting. The conductive substrate, 7000, has associated therewith contacts, 7001 and 7002, for providing current to the LED. The conductive substrate provides two primary functions. The conductor functions as a heat sink thereby allowing heat to dissipate away from the LED which has many advantages as understood in the art. Once the LED is mounted on the conductive substrate the substrate, 10, used for formation of the LED can be removed along line 7003 thereby forming an LED with superior light emission properties. Particularly preferred thermal carriers include AlN, SiC, diamond, Cu, CuW or a copper alloy. In one preferred embodiment the novel metallic substrates such as Cu—W, Cu—Mo or Cu itself will be used which is a unique method of using metallic substrates for such lateral conducting LEDs. The flip-chip mounting can be done by standard techniques with gold-tin eutectic solder bonding and gold-gold thermocompression being preferred.

The passivation material provides two primary advantages. One advantage is as an insulator between the conductors. The second advantage is to fill any voids thereby allowing for a smooth surface across the face after planarization. The passivation material is preferably a material selected from a polymer, more preferably, a non-electrically conducting polymer; and a dielectric. Particularly preferred polymers include SU-8 and BCB. Particularly preferred passivating dielectric materials include silicon-dioxide, silicon nitride and silicon oxynitride. The passivation material may be suitably deposited by plasma-enhanced chemical vapor deposition (PECVD) or chemical vapor deposition (CVD). The passivation and the planarization layer is also referred to herein as a leak suppression layer.

To avoid current crowding the charge spreading layer must be within the charge spreading distance of the furthest inward extent of the LED. The furthest inward extent is the furthest distance between the charge spreading layer and the LED in the plane of the charge spreading layer in any direction. In general, this will be the centermost portion of the LED. It is most preferred that the furthest inward extent be equidistance between multiple areas of the charge spreading layer. By example, a circular LED, with a charge spreading layer in a circle orientation around the LED will have a central point within the LED wherein the entire surrounding circle of the charge spreading layer will be an equal distance there from. With a square LED, there will be a central point which is an equal distance between four points of the charge spreading layer. It is most advantageous that the profile of the void in the charge spreading layer be the same shape as the LED.

Various configurations of the LED are illustrated in FIGS. 10a-f. The LED shape may be round, oval, obround, rectangular, trigonal, polygonal or combinations thereof. The LED may also comprise a central structure with lobes extending therefrom. For example, the LED may have a central portion with circular, or arcuate extensions. The shapes are chosen to minimize the occurrence of any portion of the LED being further than the charge spreading length as more specifically set forth herein. Furthermore, the LED shapes are chosen such that the minimum distance between LED's can be achieved, or maximum number of LED's can be contained in a given area. The LED's are preferably separated by a distance sufficient to avoid ohmic resistance. The LED's are arranged with some being connected with forward bias and some with reverse bias relative to each other. The number of forward bias and reverse bias LEDs may be the same or there may be more of one to account for differences in quantum efficiency owing to the bias difference.

The bottom $n^+$-AlGaN is preferably accessed by reactive-ion-etching using chlorine plasma. The n-ohmic contact preferably comprises Ti/Al/Ti/Au patterned and deposited using a lift-off technique. The n-ohmic contact is present in the region between every pixel to avoid current crowding.

Although preferably made of sapphire, the substrate may be made of silicon carbide, GaN, AlN, AlGaN, InN, InGaN, AlInGaN, Silicon, GaAs, LiAlO3, LiGaO3, ZnO, or a metal. The substrate preferably has a crystallographic orientation along the C-plane, A-plane, M-plane or R-plane and has a mis-orientation ranging from 0.0° to 10° from its axis.

Planarization may be achieved by a standard spin-on-glass process with filled space between the pillars. This step is preferably followed by depositing ohmic contact metallization to the p-type GaN surface of each pixel using standard e-beam (electron beam) evaporation and by utilizing Ni/Au as metals. An array of interconnecting probe-bridge contacts is deposited over the surface using Ti/Au.

With the present invention all of the pixels of the large perimeter LED are illuminated uniformly indicating the absence of current crowding.

The high operating voltages, or high series resistance, of deep UV LED's stems from poor or lower doping efficiency of high aluminum content epilayers needed from such short wavelength emission. The series resistance further increases the temperature rise of the active junction by joule heating which then results in degraded device performance. The problem becomes severe with decreasing emission wavelength and with increasing device area. Increasing the device active area has adverse effects due to the severe crowding in high aluminum content layers. The present invention solves this problem.

The present invention reduces series resistance which results in a decrease in joule heating. In the micro-pillar design the diameter is within the charge spreading length. For example, for a 280 nm UV LED the mesa diameter is preferably about 25-30 μm which is less than the estimated current spreading length of 40 μm. Furthermore, the micropillar is surrounded by n-type electrode with a small distance of separation between the pillar edge and the n-type electrode edge. Since these micropillars are immersed in a pool of n-type electrode and the diameter is less than the current spreading length the current crowding problem is eliminated. Moreover, by interconnecting each pillar with the novel flat electrode over a leakage suppression layer the total device area can be increased which reduces the device resistance and operating voltages. As a consequence of this reduction, the device is much cooler than conventional UV LED's which helps in biasing these UV LEDs to much higher drive currents.

In another embodiment of invention, the UVLED comprises vertical geometry UVLEDs wherein the anode and cathode are on the top and bottom sides of the devices.

Figure 11:
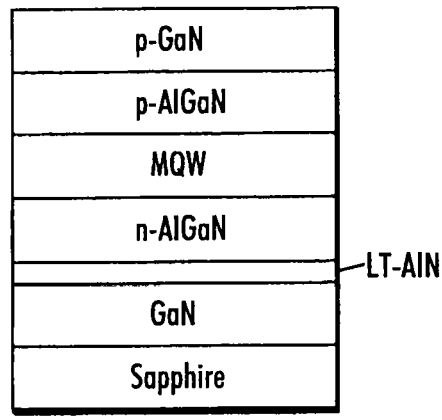
FIG. 11 schematic illustrates a vertical geometry devices with GaN buffer layer.
Figure 12:
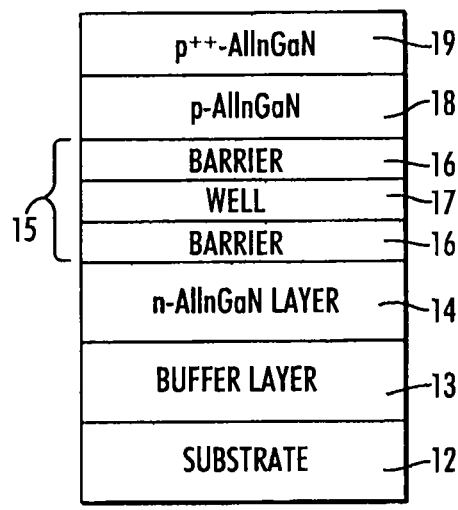
FIG. 12 schematically illustrates a representative light emitting device structure as described in this invention.

Referring to FIG. 11 a vertically injected thin-film structure is a particularly attractive device design for high power LEDs. The GaN epilayer is a sacrificial buffer layer for the laser lift-off process. Referring to FIG. 11, the gallium nitride epilayer was deposited over a sapphire substrate using a conventional metal organic chemical vapor deposition (MOCVD) technique. This layer is a sacrificial layer wherein the laser radiation was absorbed and hence the sapphire substrate can be removed. This GaN layer also helps in allowing insertion of a metamorphic AlN layer to grow the complete UV LED structure An embodiment of the invention will be described with reference to FIG. 12. The vertical LED device structure comprises a substrate, 12, a buffer layer, 13, first doped layer, 14, which is preferably n-doped, a single quantum well or multiple quantum well light emitting region, 15, comprising barrier layers, 16, and well layers, 17, a second doped layer, 18, which is preferably p-doped, and a contact layer, 19.

The substrate, 12, serves as a sacrificial base upon which epitaxial layers are formed. The substrate is subsequently removed or separated from the epitaxial layers during the process of forming the LED. As a result it is undesirable to use expensive substrate materials even though the number of inexpensive substrate materials which are suitable for Group III nitride based LEDs is limited due to the propensity for defect propagation when a Group III nitride is applied to a material with mismatched lattice parameters. The instant invention provides a method for limiting defect propagation thereby allowing the use of less expensive substrates, such as sapphire, which is preferred due to the low cost and availability relative to other substrates. Other substrates such as silicon carbide, silicon, gallium nitride, aluminum nitride, gallium arsenide, $AlIn_yGa_{1-x-y}N$ wherein $0<x<1$, $0<y<1$ and $0<x+y<1$ and/or other microelectronic substrates, can be used but sapphire is most preferred. The substrate may be polar, semi-polar or non-polar and it may be patterned or non-patterned. The substrate may be porous and the porosity may be done in-situ or ex-situ.

The buffer layer, 13, consists of at least one layer of $Al_xIn_yGa_{1-x-y}N$ wherein $0<x<1$, $0<y<1$ and $0<x+y<1$. In one preferred embodiment, the $Al_xIn_yGa_{1-x-y}N$ layer that is used as the sacrificial layer for laser liftoff, also referred to as a lift-off layer, is deposited via pulsed atomic layer epitaxial (PALE) growth, and most preferably it is an aluminum nitride layer, although this is not necessary for the present invention. The PALE growth technique greatly improves the quality of the layer by enhancing a two dimensional step-growth mode.

In another preferred embodiment, the buffer layer 13 consists of the preferred sacrificial layer includes at least one strain layer superlattice consisting of alternating layers of $Al_xIn_yGa_{1-x-y}N/Al_rIn_sGa_{1-r-s}N$ such that $0<x\le 1$, $0\le y\le 1$, $0<x+y\le 1$, $0<r\le 1$, $0\le s\le 1$, and $0<r+s\le 1$ and the bandgap of the two materials are not the same. In a preferred embodiment, the materials are deposited via PALE deposition, although this is not necessary for the present invention. The superlattice layers function as dislocation filters wherein defect bending results in a decrease in the magnitude of defects that extend to the subsequent light emitting region.

In another preferred embodiment, the buffer layer, 13, consists of a series of layers and laterally overgrown layers that are formed through a combination of PALE growth, conventional growth, and pulsed lateral overgrowth (PLOG).

Pulsed lateral overgrowth (PLOG) is a technique wherein a Group III comprising material such as triethyl gallium, or an trialkly aluminum and a nitrogen material such as ammonia, are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5 which is incorporate herein by reference. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

The Pulse atomic layer epitaxy (PALE) approach allows accurate control of the quaternary layer composition and thickness by simply changing the number of aluminum, indium, and gallium pulses in a unit cell and the number of unit cell repeats.

(J. Zhang et al., Applied Physics Letters, Vol. 79, No. 7, pp. 925-927, 13 Aug. 2001, J. P. Zhang et al. Applied Physics Letters, Vol. 81, No. 23, pp. 4392-4394, 2 Dec. 2002). By controlling the pulse time, pulse condition, flow rate, and therefore chemical availability, the systematic growth provides a layer which significantly control the composition, thickness and crystalline quality.

Referring again to FIG. 12, a doped semiconductor layer, 14, is applied to the buffer region, 13. The doped semiconductor layer, 14, is preferably an n-type semiconductor, more preferably a Group III nitride layer doped with n-type dopants, such as silicon, indium, oxygen, carbon, or simultaneous doping of combinations of the previously mentioned species. Layer 14 shall have a bandgap energy such that it is transparent to the wavelength of light emitted by the light emitting region. The doped semiconductor may be a p-type semiconductor if the doped layer opposite the light emitting region is a n-type semiconductor.

The Group III nitride layer 14 is followed by the light emitting region, 15, which contains either a single quantum well or multiple quantum wells. The quantum well active region, 15, comprises barrier layers, 16, and quantum wells, 17. In a particular embodiment, the quantum well active region 15 preferably includes from 1 to 12 quantum wells, 17, without limit thereto. The thickness and composition of the well and barrier layers may be selected so as to provide emission at a desired output wavelength in the ultraviolet region of the electromagnetic spectrum. Furthermore, changes in composition of the well layer may be offset by changes in the thickness of the well layer. For example, to provide an output wavelength of 340 nm, a GaN well layer having a thickness of about 15 Å may be utilized, whereas to provide an output wavelength of 320 nm, an AlGaN well layer may be utilized. Thus, to select the characteristics of the quantum well and barrier layers, the thickness and composition of the barrier and well layers may be selected so as to provide optimized performance. This may include balancing sufficient composition to provide carrier confinement for the emission wavelength while maintaining performance. This may also include optimizing thickness to provide sufficient carrier confinement while minimizing stress (strain) in the film, which in turn minimizes cracking in the epitaxial layers. Particular structures of the quantum well active region 15 are described in further detail below. The barrier layer preferably comprises $Al_xIn_yGa_{1-x-y}N$ wherein $0\le x\le 1$, $0\le y\le 1$, $0\le x+y\le 1$.

Returning to FIG. 12, a doped layer 18, preferably doped with p-type dopants is provided on the multiple quantum well active region, 15. In particular embodiments of the present invention, the doped layer, 18, may be doped with magnesium, zinc, beryllium, or combinations of the aforementioned species. The bandgap energy of the doped layer, 18, is greater than or equal to the bandgap of the layer adjacent to it from 15 such that it provides an energy barrier for carrier flow, referred to as an electron blocking layer by those skilled in the art. The doped layer, 18, preferably has a thickness of from about 50 Å to about 0.5 µm.

The quantum well active region, 15, comprises quantum well structures including a barrier layer, 16, and a well layer, 17, potentially with multiple repetitions of each. The well layer or layers, 17, are contained between two opposing barrier layers, 16. Thus, for m well layers, 17, m or m+1 barrier layers, 16, are provided depending on whether the last layer of 15 is a barrier layer. Furthermore, a barrier layer, 16, may be provided as one or more layers as described, for example, in United States Patent Publication No. 2003/0006418 entitled GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES, or United States Patent Publication No. 2006/0267043 entitled DEEP ULTRAVIOLET LIGHT EMITTING DEVICES AND METHODS OF FABRICATING DEEP ULTRAVIOLET LIGHT EMITTING DEVICES, both disclosure of which are incorporated herein as if set forth in its entirety. The barrier layers, 16, and the well layers, 17, may be fabricated using conventional Group III nitride growth techniques such as those discussed above. In particular embodiments of the present invention, the barrier layer, 16, has a preferable thickness of from about 5 Å to about 300 Å and the well layer, 17, has a preferable thickness of from about 5 Å to about 300 Å.

A contact layer, 19, may also be provided on the doped layer, 18. The contact layer, 19, may be a III-Nitride based layer and may have a lower percentage of Al than the doped layer, 18, or a higher doping concentration than the doped layer 18. The contact layer, 19, may be doped with a p-type dopant, such as Mg, Zn, Be, or any combination of the aforementioned species and may have a thickness of from about 10 Å to about 1.0 µm. The doped layer, 18, and the contact layer, 19, may be fabricated using conventional Group III nitride growth techniques such as those discussed herein.

The buffer layer 13 and other device epilayers (14,15,16, 17,18 and 19) can be grown by metal organic chemical vapor deposition (MOCVD), pulsed metal organic chemical vapor deposition, metal organic hydride vapor phase epitaxy (MO-HVPE), pulsed metal organic hydride vapor phase epitaxy, hydride vapor phase epitaxy (HVPE), molecular beam epitaxy (MBE), or any combination thereof.

The semiconductor layers (13-19) can be grown by pulsing the concentration of precursors such as trialkyl (ethyl or methyl but preferably methyl) aluminum or gallium, or ammonia. Pulsing of precursor concentration assists in atomic layer surface migration of materials which improves the material properties of the layer. This growth technique has been referred to in several forms in the prior art and also incorporated in this patent as a PALE growth technique.

Figure 13:
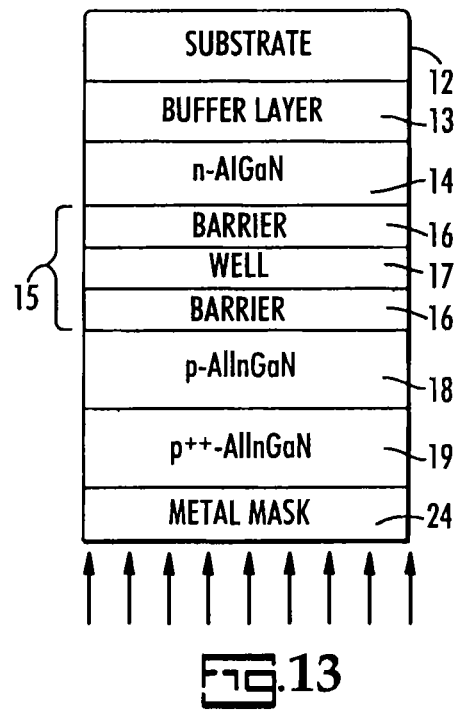
FIG. 13 indicates the process to create deep isolation trenches to avoid epilayer cracks.

Referring to FIG. 13, the device epilayers required for the realization of deep UV LED's are highly strained due to the high aluminum content. To avoid cracking of epilayers after laser assisted substrate lift-off it is preferable to form isolation trenches 23 from the epilayer side. In a preferred embodiment, these trenches are formed using a metal mask, 24, comprising metals such as Ti, Ni and dielectrics such as silicon dioxide. The trenches are formed using standard photolithographic processes that are well known to those skilled in the art. The metal mask is removed after trench formation.

Figure 14:
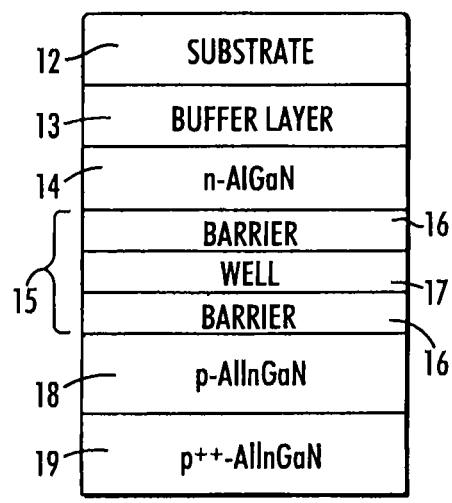
FIG. 14 shows the process of filling the isolation trenches with dielectric or soft polymers.

Referring to FIG. 14, in one embodiment the substrate comprises isolation trenches between individual devices and trenches are filled with a soft polymer. The polymers are preferably selected from re-flow photo-resist SU-8, spin on glass (SOG) and benzo-cylco-butene (BCB). Re-flow photo-resist SU-8 is a commonly used negative photoresist available from various commercial sources. These polymers are preferred due to their ease of patterning by standard photolithography, viscosity, temperature stability and dielectric strength. The polymers should be able to withstand back-end processing conditions, such as a temperature from about 30° C. to about 800° C., bonding pressures, etc. They should also have a high dielectric strength, be electrically non-conductive and inert to UV radiation and chemicals.

Referring again to FIG. 14, in another embodiment the substrate comprises isolation trenches between individual devices and the trenches are filled with a dielectric, preferably selected from silicon dioxide and silicon nitride. These dielectrics are typically, but not limited to, deposition using plasma enhanced chemical vapor deposition (PECVD). In one embodiment the dielectric is formed by using ammonia, silane, di-silane, tetra-ethyl ortho silicate, oxygen, nitrous oxide and helium as precursor gases. The temperature preferably ranges from 70° C. to 300° C. Typical pressure ranges from 300 mTorr to 1000 mTorr are used. The radio frequency power (RF power) preferably ranges from 10 watts to 200 watts. Other techniques such as e-beam sputtering may be employed to form the dielectric. The dielectrics can also be deposited by a novel dielectric deposition technique using PECVD systems as described in U.S. patent application Ser. No. 11/800,712 filed May 7, 2007. The dielectric should be able to withstand back-end processing conditions, such as a temperature from about 30° C. to about 800° C., bonding pressure, etc. They should also have a high dielectric strength, be electrically non-conductive and inert to UV radiation and chemicals.

Figure 15:
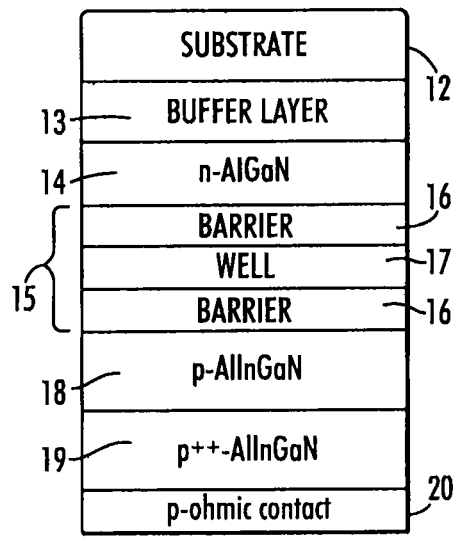
FIG. 15 depicts a schematic of the device with ohmic contacts to one type of material preferably p-type conductivity.

Referring to FIG. 15, an ohmic contact, 20, may be provided on the contact layer, 19. The contacts may be a platinum contact. Other materials may be used for the ohmic contact. For example, the ohmic contact may comprise rhodium, zinc oxide, palladium, palladium oxide, titanium, nickel/gold, nickel oxide/gold, nickel oxide/platinum indium tin oxide and/or titanium/gold, gold/tin. The ohmic contact may be followed up by a stack of metal layers comprised of any combination of the above mentioned metal layers. In some embodiments, the ohmic contact has an average thickness ranging from 10 Å to 10 µm. The ohmic contact may be formed by electron beam (e-beam) evaporation or any other suitable techniques for controllably forming atomically thin metallic films.

Figure 16:
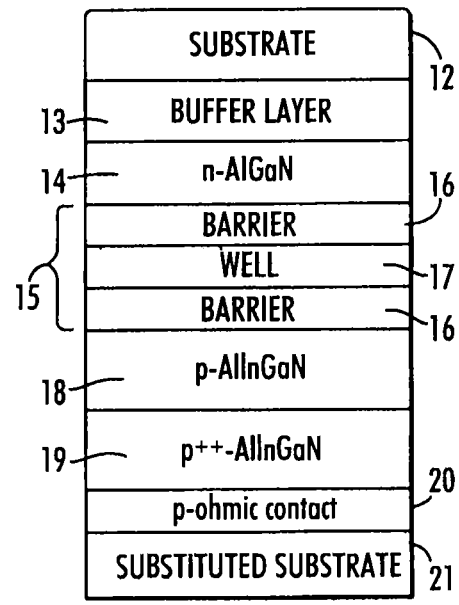
FIG. 16 depicts a schematic showing bonding of the device to the substitutional substrate.

The light emitting device may be mounted by a flip-chip technique. The devices, typically called "dies" in the art, are mounted with the active epilayer side facing the carrier, also referred to as a sub-mount (or as "substituted substrate 21" in FIG. 16), by various bonding techniques known in the art including but not limited to, bump-bonding, thermosonic bonding, eutectic bonding or epoxy bonding wherein a suitable material is deposited at specific places on both the die and carrier. Specific preferred bonding materials include, but are not limited to, mixtures, preferably eutectic mixtures of tin, gold, lead and indium; silver paint and the like. Bonding materials are preferably deposited by thermal evaporation for thickness control but can be deposited by other techniques such as by electroplating, sputtering, etc.

Referring again to FIG. 16, the contact on the substituted substrate may be any suitable material. Typically polycrystalline aluminum nitride, aluminum nitride, silicon, alloy of titanium-tungsten and copper, alloy of copper-tungsten, silicon-carbide are used a substituted substrate or carriers. Any suitable technique for forming a contact to the substrate 21 may be utilized. Such techniques are known to those of skill in the art and, therefore, need not be described further herein. The invention described herein is not limited to structures having crystalline epitaxial growth substrates as substituted substrates. These carrier substrates, or submounts, may have thermal, electrical, structural and/or optical characteristics which are better suited to the finished product than the native substrate.

Figure 17:
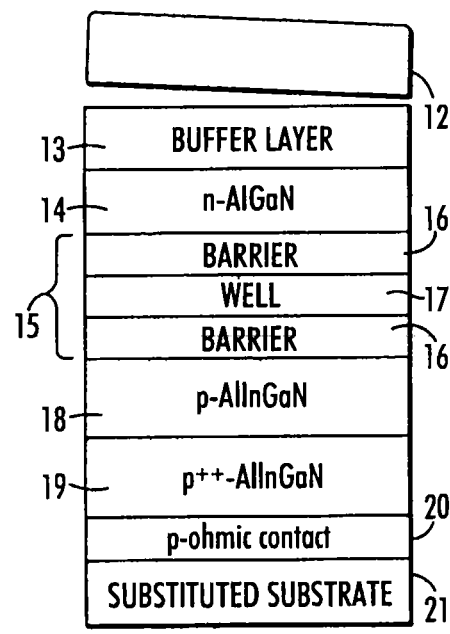
FIG. 17 a schematic of the device with the native substrate lifted-off.

Referring to FIG. 17, it is preferred to separate the sandwich comprising the n-type semiconductor, multiple quantum well and p-type semiconductor at the strain relieved buffer layer. The separation is typically accomplished by laser assisted lift-off using an appropriate wavelength of light. For GaN the appropriate wavelength of laser for lift-off is about 248 nm whereas for $Al_xIn_yGa_{1-x-y}N$ where x>0 the appropriate wavelength of the laser is about 193 nm. It is preferable to use an AlN as a lift off layer as described herein and a 193 nm laser for lifting off the substrate from the device structure.

After lift-off the remaining structure may be dipped in an acid such as hydrochloric acid, phosphoric acid or sulphuric acid with, or without water to remove unwanted metallic droplets from the laser irradiation. After liftoff the substrate may be dipped in a caustic solution such as potassium hydroxide, ammonium hydroxide, hydrogen peroxide or the like with, or without, water to remove unwanted metallic droplets from the laser irradiation.

Figure 18:
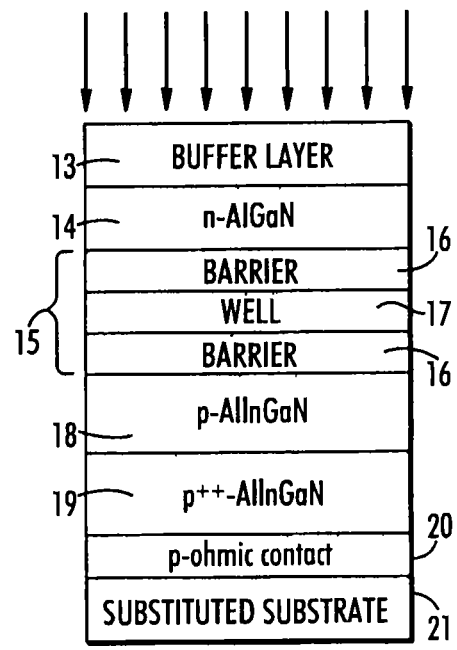
FIG. 18 shows material removal to access the second conductive layer.

Referring to FIG. 18, the remaining buffer from layer 13, will be ideally etched by inductively coupled plasma etching and reactive ion etching in suitable chemical ambient such as a mixture of boron-trichloride, chlorine and argon gases. In some embodiments, the etching will be performed only by reactive ion etching and may not involve the ICP power source but is not limited thereto. In some embodiments, the reactive etching will consist only of boron-trichloride and argon with specifically chlorine gas turned-OFF to improve the surface conditions of the finished n-type contact layer. In another embodiment, the remaining buffer is removed via either wet chemical etching, photoelectrical chemical wet etching, or lap and polish techniques that are well known to those skilled in the art.

Figure 19:
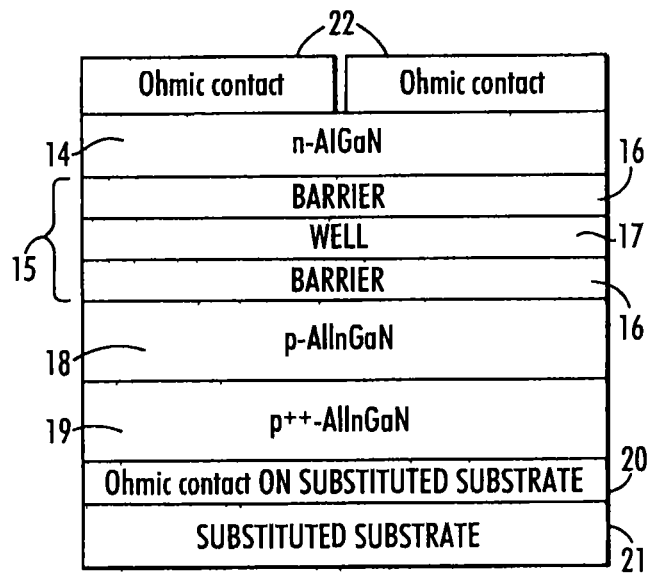
FIG. 19 shows the vertically conducting device with contacts on opposite sides of the epilayers.

Referring to FIG. 19, an ohmic contact, 22, may be provided on the contact layer, 14. The contacts may be a titanium contact. Other materials may be used for the ohmic contact. For example, the ohmic contact may comprise rhodium, aluminum, vanadium, vanadium nitride, titanium nitride, tantalum, tantalum nitride gold and/or any combination of the above mentioned metals. The ohmic contact may be followed up by a stack of metal layers such as titanium/gold, electroplated thick gold needed for external wire-bonding and flip-chip packaging. In some embodiments, the ohmic contact and the subsequent metal stack combined together has an average thickness of less than 10 μm. In some embodiments, the combined metal stack has a combined thickness ranging from 500 Å to 10 μm.

The ohmic contact may be formed by electron beam (e-beam) evaporation or any other suitable techniques for controllably forming atomically thin metallic films. For example, it may be possible to form the ohmic contacts by electroplating, or thermal evaporation provided adequate process control is maintained. The geometrical configuration of the contact is designed such that there are areas of the n-type layer that are not in intimate contact with the contact metal to enhance the extraction of light from the device. This configuration is designed to maximize light extraction, while simultaneously minimizing input resistance.

Again referring to FIG. 19, the contact to layer 14 has partial opening to allow the UV light to escape from the semiconductor for efficient light extraction.

Referring to FIG. 19, The nitrogen face epilayer (layer 14) on the top side is susceptible to chemical etching with acids and bases such as hydrocholoric acid, sulphuric acid, phosphoric acid, ammonium hydroxide, potassium hydroxide, hydrogen peroxide or any combination thereof such that the surface may be etched by hydrochloric acid followed by dipping in ammonium hydroxide or a similar combination. This treatment makes the surface rough thereby allowing more light to be scattered and hence improves the efficiency of the devices.

Figure 20:
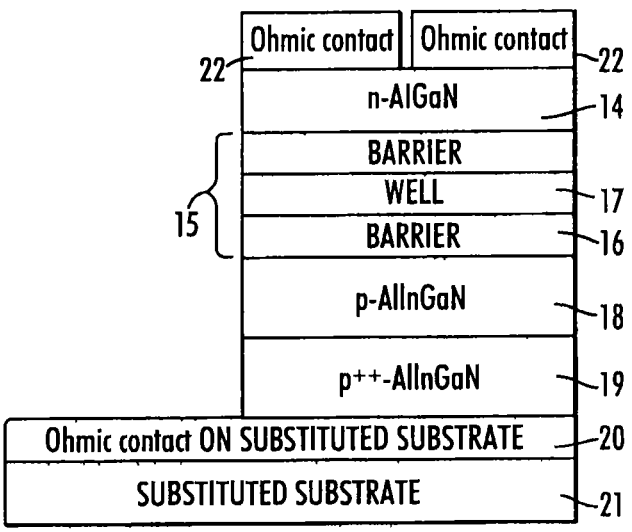
FIG. 20 schematically illustrates a vertically conducting light emitting device.

A completed vertical ultraviolet light emitting device with peak emission wavelength of less than 365 nm is illustrated in FIG. 20. In FIG. 20 the device, generally comprises layers 14-19 as described above which remain after the substrate is removed. A substitute substrate, 21, is applied, preferably on the p-type semiconductor side. Ohmic contacts, 20 and 22 are applied to provide connectivity.

Figure 21:
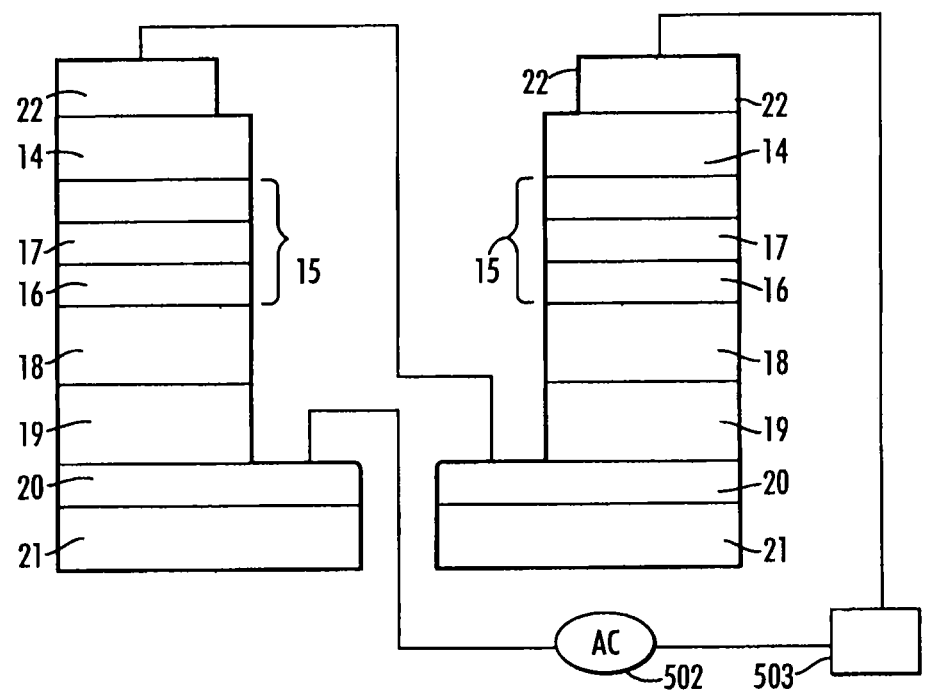
FIG. 21 is a schematic representation of an embodiment of the present invention.

An embodiment of the invention is illustrated in FIG. 21. In FIG. 21 two LEDs as described in FIG. 20 are electrically connected anode to cathode. An AC power source, 502, provides alternating power wherein the at least two LEDs illuminate in alternate patterns. A component, 503, is provided as described herein.

The device may further comprise an epoxy dome to enhance light output. The preferred polymers are a mixture of silicone elastomers. The right composition of such materials are formed by mixing a two part adhesive namely part A (base) and part B (curing agent) in correct proportions. The proportional ratio varies depending upon emission wavelength of devices. Typical examples are 4:2, 6:1, 8:1, 10:1, 5:5, 2:6, 7:3 but is not limited thereto. Other silicone polymer can also be used. The adhesive is formed into a dome shape, and thermally cured between 50° C.-300° C. in ambients such as oxygen, air, nitrogen, vacuum or argon for proper transparency and form. The domes are carefully attached by providing a droplet of the same polymer over the die. The droplet of polymer migrates towards the entire chip due to surface tension and once the dome is placed over the die the polymer cures thereby securing the dome to the light emitting diode package.

The UVLED package and circuits are typically controlled by a driver. The UVLED circuit may include as few as one LED or an array of anti-parallel LEDs driven with AC power sources and drivers relying on various voltages and frequencies. The UVLEDs are preferably pre-packaged in various forms and materials and design for mains or high frequency coupling in standard AC power sources.

The present invention is described with reference to preferred embodiment without limit thereto. One of skill in the art would readily realize additional improvements, alterations and embodiments without departure from the scope of the present invention which is more specifically set forth in the claims appended hereto.

The invention claimed is:

1. An illuminator comprising:
  a multiplicity of vertical geometry UV emitting diodes with each diode of said multiplicity of vertical geometry UV emitting diodes comprising:
    a substrate;
    a lift-off layer coated on said substrate comprising $Al_X In_Y Ga_{1-X-Y}N$ wherein $0<x\leq 1$, $0\leq y\leq 1$, $0<x+y\leq 1$;
    a first doped layer on said lift-off layer wherein said first doped layer comprises $Al_X In_Y Ga_{1-X-Y}N$ wherein $0<x\leq 1$, $0\leq y\leq 1$, $0<x+y\leq 1$ and said first doped layer has a first conductivity;
    a multilayer quantum well region on said first doped layer comprising alternating layers of:
      a quantum well comprising $Al_X In_Y Ga_{1-X-Y}N$ wherein $0<x\leq 1$, $0\leq y\leq 1$, and $0<x+y\leq 1$; and
      a barrier layer on each surface of said quantum well having a band gap larger than a quantum well bandgap and said barrier layer comprises $Al_X In_Y Ga_{1-X-Y}N$ wherein $0<x\leq 1$, $0\leq y\leq 1$, $0<x+y\leq 1$ and wherein said multilayer quantum well terminates with said barrier layer on each side thereof;
    a second doped layer on said quantum well region wherein said second doped layer comprises $Al_X In_Y Ga_{1-X-Y}N$ wherein $0<x\leq 1$, $0\leq y\leq 1$, $0<x+y\leq 1$ and said second doped layer has a different conductivity and dopant type than said first doped layer;
    a contact layer on said second doped layer comprising $Al_X In_Y Ga_{1-X-Y}N$ wherein $0\leq x\leq 1$, $0\leq y\leq 1$, $0\leq x+y\leq 1$ wherein said contact layer has a different conductivity than said second doped layer;
    a first metallic contact formed on the backside of the first doped layer; and
    a second metallic contact formed on the second doped contact layer in a vertical geometry orientation;
  a first termination in electrical contact with a first metallic contact of a first diode of said diodes and a second termination in electrical contact with a second metallic contact of a second diode of said diodes;
  wherein at least two diodes of said multiplicity of vertical geometry UV emitting diodes are connected in a configuration selected from electrical parallel and electrical series; and
  when AC power is connected to said first termination and said second termination said two diodes alternately illuminate.

2. The illuminator of claim 1 wherein said first LED emits ultraviolet light at increasing voltage.

3. The illuminator of claim 1 wherein said second LED emits ultraviolet light at decreasing voltage.

4. The illuminator of claim 1 wherein the lift-off layer comprises $Al_xIn_yGa_{1-X-Y}N$ wherein $0.01<x\leq1$, $0\leq y\leq1$, $0.01<x+y\leq1$.

5. The illuminator of claim 1 wherein said lift-off layer is deposited in such a way that the group III and group V materials are injected via a pulsed growth method wherein the group III and group V materials do not have continuous flow, but are pulsed either sequentially, or such that the group III source pulses are partially on with no group V source pulse or partially overlap with a group V source pulse.

6. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ wherein $0<x\leq1$, $0\leq y\leq1$, $0<x+y\leq1$, and $0<r\leq1$, $0\leq s\leq1$, $0<r+s\leq1$ and the bandgap of the two materials is not identical.

7. The illuminator of claim 6 wherein said strain relief superlattice layer is doped with at least one dopant selected from the group consisting of silicon, indium, oxygen and carbon.

8. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ wherein $0.1\leq x\leq1$, $0\leq y\leq1$, $0.1\leq x+y\leq1$, and $0<r\leq1$, $0\leq s\leq1$, $0<r+s\leq1$ and the bandgap of the two materials is not identical.

9. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ wherein $0.5\leq x\leq1$, $0\leq y\leq1$, $0.5\leq x+y\leq1$, and $0<r\leq1$, $0\leq s\leq1$, $0\leq r+s\leq1$ and the bandgap of the two materials is not identical.

10. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ wherein $0.9\leq x\leq1$, $0\leq y\leq1$, $0.9\leq x+y\leq1$, and $0<r\leq1$, $0\leq s\leq1$, $0<r+s\leq1$ and the bandgap of the two materials is not identical.

11. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ wherein $0.9\leq x\leq1$, $0\leq y\leq1$, $0.9\leq x+y\leq1$, and $0.1\leq r\leq1$, $0\leq s\leq1$, $0.1\leq r+s\leq1$ and the bandgap of the two materials is not identical.

12. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ wherein $0.9\leq x\leq1$, $0\leq y\leq1$, $0.9\leq x+y\leq1$, and $0.3\leq r\leq1$, $0.3\leq r+s\leq1$ and the bandgap of the two materials is not identical.

13. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ such that $0.9\leq x\leq1$, $0\leq y\leq1$, $0.9\leq x+y\leq1$, and $0.5\leq r\leq1$, $0\leq s\leq1$, $0.5\leq r+s\leq1$ and the bandgap of the two materials is not identical.

14. The illuminator of claim 1 further comprising a strain relief superlattice layer between said lift-off layer and said first doped layer wherein said strain relief superlattice layer comprises repeating periods of $Al_xIn_yGa_{1-X-Y}N$ and $Al_rIn_sGa_{1-r-s}N$ such that $0.9\leq x\leq1$, $0\leq y\leq1$, $0.9\leq x+y\leq1$, and $0.7\leq r\leq1$, $0\leq s\leq1$, $0.7\leq r+s\leq1$ and the bandgap of the two materials is not identical.

15. The illuminator of claim 1 further comprising said a second doped layer and a first doped layer and said multiple quantum well comprising $Al_xIn_yGa_{1-X-Y}N$ wherein $0\leq x\leq1$, $0\leq y\leq1$, $0\leq x+y\leq1$) wherein said first doped layer and a said second doped layer have a different composition.

16. The illuminator of claim 1 wherein said quantum well comprises a single quantum well and multiple quantum well layers.

17. The illuminator of claim 16 wherein said multiple quantum well comprises alternating layers of $Al_xGa_{1-x}N$, wherein $0\leq x<1$, and $Al_yGa_{1-y}N$ wherein $0<y<1$ and wherein x and y are not equal.

18. The illuminator of claim 16 wherein said quantum well is doped with at least one n-type dopant selected from silicon, indium and oxygen and with at least one p-type dopant selected from magnesium, zinc and beryllium.

19. The illuminator of claim 16 wherein said multiple quantum well emits with a wavelength λ having a wavelength defined by 190 nm ≤ λ ≤ 369 nm.

20. The illuminator of claim 16 wherein said multiple quantum well emits with a wavelength λ having a wavelength defined by 190 nm ≤ λ ≤ 340 nm.

21. The illuminator of claim 16 wherein said multiple quantum well emits with a wavelength λ having a wavelength defined by 190 nm ≤ λ ≤ 310 nm.

22. The illuminator of claim 16 wherein said multiple quantum well emits with a wavelength λ having a wavelength defined by 190 nm ≤ λ ≤ 290 nm.

23. The illuminator of claim 16 wherein said multiple quantum well emits with a wavelength λ having a wavelength defined by 190 nm ≤ A ≤ 270 nm.

24. The illuminator of claim 16 wherein said quantum well comprises non-radiative and radiative recombination of electrons and holes to generate UV photons and said radiative recombinations dominate over the non-radiative recombination.

25. The illuminator of claim 1 wherein said substrate comprises a material selected from the group consisting of silicon, $Al_xIn_yGa_{1-X-Y}N$ wherein $0\leq x\leq1$, $0\leq y\leq1$, $0\leq x+y\leq1$), zinc oxide, gallium arsenide, silicon carbide, lithium aluminate, lithium gallate and sapphire.

26. The illuminator of claim 25 wherein said substrate is selected from polar, semi-polar and non-polar crystal orientations.

27. The illuminator of claim 26 wherein said substrate is patterned.

28. The illuminator of claim 1 further comprising a second doped layer between said quantum well region and a said contact layer wherein said second doped layer comprises $Al_xIn_yGa_{1-x-y}N$ wherein $0<x\leq1$, $0\leq y\leq1$, $0<x+y\leq1$, second doped layer has a different conductivity and dopant type than said first doped layer.

29. The illuminator of claim 1 wherein said contact layer comprises a p-type $Al_xIn_yGa_{1-X-Y}N$ wherein $0\leq x\leq1$, $0\leq y\leq1$, $0\leq x+y\leq1$ layer.

30. The illuminator of claim 1 wherein said contact layer comprises a p-type $Al_xIn_yGa_{1-X-Y}N$, and $Al_rIn_sGa_{1-r-s}N$ wherein $0\leq x\leq1$, $0\leq y\leq1$, $0\leq x+y\leq1$ and $0\leq r\leq1$, $0\leq s\leq1$, $0\leq x+y\leq1$ and the composition of the two layers is not identical.

31. The illuminator of claim 1 further comprising an epoxy dome.

* * * * *